United States Patent [19]
Ito et al.

[11] Patent Number: 5,141,893
[45] Date of Patent: Aug. 25, 1992

[54] GROWTH OF P TYPE GROUP III-V COMPOUND SEMICONDUCTOR ON GROUP IV SEMICONDUCTOR SUBSTRATE

[75] Inventors: Chris R. Ito, Colorado Springs; David McIntyre, Monument; Robert Kaliski; Milton Feng, both of Colorado Springs, all of Colo.

[73] Assignee: Ford Microelectronics, Colorado Springs, Colo.

[21] Appl. No.: 658,058

[22] Filed: Feb. 20, 1991

Related U.S. Application Data

[63] Continuation of Ser. No. 288,560, Dec. 22, 1988, abandoned.

[51] Int. Cl.$^5$ ............................................. H02L 21/20
[52] U.S. Cl. .................................. 437/81; 437/82; 437/105; 437/107; 437/108; 437/111; 437/132; 437/112; 437/126
[58] Field of Search ................. 148/DIG. 17, 22, 25, 148/41, 56, 65, 72, 97, 110, 169, 33-33.4; 427/248.1, 258, 255.1; 437/81, 82, 108, 105, 107, 111, 112, 126, 132, 939, 946, 945, 976

[56] References Cited

U.S. PATENT DOCUMENTS

| | | | |
|---|---|---|---|
| 4,561,916 | 12/1985 | Abiyama et al. | 156/612 |
| 4,588,451 | 5/1986 | Vernon | 437/126 |
| 4,699,688 | 10/1987 | Shastry | 156/610 |
| 4,826,784 | 5/1989 | Salerno et al. | 437/132 |
| 4,902,643 | 2/1990 | Shimawaki | 156/613 |

OTHER PUBLICATIONS

Ishida et al., "... GaAs Layers Growth Si Substrates by MOCVD", Jpn. J. Appl. Phys., vol. 26, No. 5, May 1987, pp. L530-L532.

Akiyama et al., "Growth of GaAs on Si by MOCVD", J. Crys. Growth, 68(1984), pp. 21-26.

Mizuguchi et al., "MOCVD GaAs Growth on Ge(100) and Si(100) Substrates", J. Crys. Growth, 77(1986), pp. 509-514.

Primary Examiner—Robert Kunemund
Attorney, Agent, or Firm—Evenson, Wands, Edwards, Lenahan & McKeown

[57] ABSTRACT

'Unintentionally' doped P type GaAs is grown on silicon by a metal organic chemical vapor deposition process in which the molecular ratio of arsenic to gallium in the growth ambient is reduced to a value that is sufficiently low to cause the creation of donor (As) site vacancies in the grown GaAs layer, which become occupied by acceptor (carbon) atoms in the metal organic compound, thereby resulting in the formation of a buffer GaAs layer having a P type majority carrier characteristic. Preferably, the silicon substrate has its growth surface inclined from the [100] plane toward the [011] direction is initially subjected to an MOCVD process (e.g. trimethyl gallium, arsine chemical vapor deposition) at a reduced temperature (e.g. 425° C.) and at atmospheric pressure, to form a thin (400 Angstroms) nucleation layer. During this growth step the Group V/Group III mole ratio (of arsenic to gallium) is maintained at an intermediate value. The temperature is then ramped to 630° C. and gas content adjusted to reduce the V/III mole ratio to a value less than 5.0, so as to grow a buffer layer of GaAs is grown on the nucleation layer. Because the molecular ratio of arsenic to gallium in the metal organic/arsine ambient is at a substantially reduced value, the resulting GaAs buffer layer tends to be depleted of arsenic atoms at numerous crystal sites, which allows for the substitution of acceptor (carbon) atoms from the metal organic compound, so that the buffer GaAs layer is P type.

13 Claims, 2 Drawing Sheets

GROWTH OF P TYPE GROUP III-V COMPOUND SEMICONDUCTOR ON GROUP IV SEMICONDUCTOR SUBSTRATE

This is a continuation of application Ser. No. 288,560, filed Dec. 22, 1988, now abandoned.

FIELD OF THE INVENTION

The present invention relates in general to the manufacture of semiconductor devices and is particularly directed to a technique of growing a P type Group III-V compound semiconductor material, such as gallium arsenide, on a Group IV semiconductor substrate, such as silicon.

BACKGROUND OF THE INVENTION

The integration of Group IV semiconductor materials, such as germanium and silicon, and Group III-V compound (e.g. GaAs, InP, GaP)-resident circuit architectures within a monolithic structure has given rise to proposed methodologies for the heteroepitaxial growth of Group III-V compound semiconductor materials, notably GaAs, on Group IV semiconductor material, such as silicon. In some applications, for example where Group III-V compound semiconductor material, such as GaAs, is employed as an intermediate layer for subsequent crystal growth, conductivity type (majority carrier) is of little interest. However, most applications are dependent on conductivity type since device fabrication in the GaAs layer is intended. Unfortunately, conventional methodologies for growing Group III-V compound semiconductor materials, such as GaAs, on Group IV semiconductor substrates, e.g. silicon, such as by molecular beam epitaxy or metal organic chemical vapor deposition, yield a GaAs layer that is inherently N type, which can result in significant interdevice leakage currents for commonly used N channel MESFETs that have been formed in the GaAs layer.

SUMMARY OF THE INVENTION

In accordance with the present invention, the inability of conventional processes to successfully grow P type Group III-V compound semiconductor material, in particular GaAs, on a Group IV semiconductor substrate, such as silicon, are obviated by a new and improved metal organic chemical vapor deposition process in which the molecular ratio of arsenic to gallium in the growth ambient is reduced to a value that is sufficiently low to cause the creation of donor (As) site vacancies in the grown GaAs layer, which become occupied by acceptor (carbon) atoms in the metal organic compound, thereby resulting in an "unintentionally" doped GaAs layer having a P type majority carrier characteristic.

In accordance with a preferred embodiment of the present invention, a silicon substrate, having a substantially planar growth surface that is tilted or inclined from the [100] crystallographic plane toward the [011] crystallographic direction by a minor misorientation angle up to a value on the order of 4°, is placed in a reactor chamber and subjected to an MOCVD process (e.g. trimethylgallium, arsine chemical vapor deposition) at a reduced temperature (e.g. 425° C.) and at atmospheric pressure, to form a thin (less than 400 Angotroma) nucleation layer on the surface of the silicon substrate. During this growth step the Group V/Group III (hereinafter denoted V/III) mole ratio (of arsenic to gallium) is maintained at an intermediate value on the order of 10.0. The reactor temperature is then ramped to 630° C. and the content of the ambient gas adjusted to reduce the V/III mole ratio to a value less than 5.0, so as to grow a 2.5 micron thick buffer layer of GaAs on the nucleation layer at a rate of five microns per hour.

Because the molar ratio of arsenic to gallium in the TMG/ambient is at a substantially reduced value (less than 5.0), the resulting GaAs buffer layer tends to be depleted of arsenic atoms at numerous crystal sites, which allows for the substitution of acceptor (carbon) atoms from the metal organic compound, resulting in an 'unintentionally' (carbon) doped GaAs layer having a P type majority carrier characteristic. The resulting P type GaAs on Si material exhibits low leakage current between N ohmic metal pads and allows for the fabrication of ionimplanted N channel field effect devices and integrated circuits, that are mutually isolated by the P type material of the GaAs layer. In addition, crystallographic analysis has revealed a reduction in microtwin defect density by an order of magnitude compared with conventionally produced N type GaAs on silicon.

DETAILED DESCRIPTION

Example

The process for growing P type Group III-V compound semiconductor on Group IV semiconductor material in accordance with the present invention is preferably carried out using a conventional chemical vapor deposition reactor commonly used in the semiconductor manufacturing industry. In the present example the process will be described for the growth of an 'unintentionally' doped P type gallium arsenide buffer layer on a silicon substrate. By unintentionally doped is meant that the resultant P type majority carrier characteristic is not obtained by deliberately or intentionally employing a specific dopant material (e.g. a source of acceptor ions). Rather, it is the result of the adjustment of processing parameters, in particular a substantial reduction in the content of the gas ambient to which the growth surface of the silicon substrate is exposed, during the formation of the gallium arsenide buffer layer.

Figure 1:
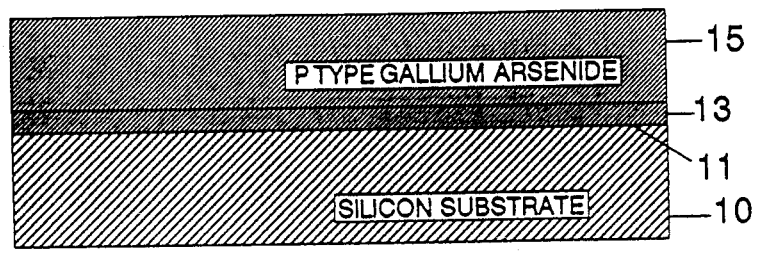
FIG. 1 is a diagrammatic cross-sectional illustration of a P type gallium arsenide layer grown on a silicon substrate.
Figure 2:
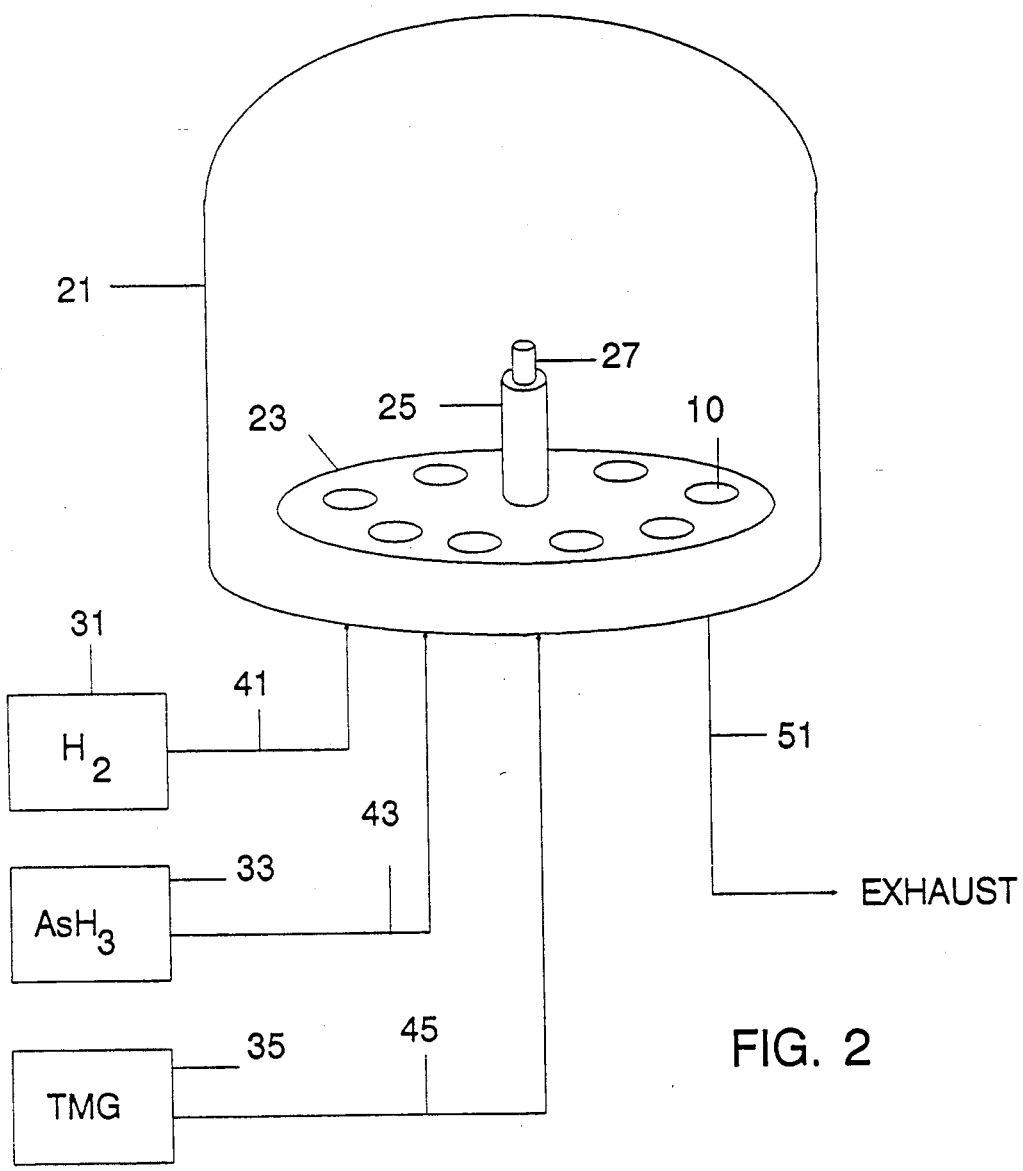
FIG. 2 illustrates reactor equipment for growing a P type gallium arsenide layer on a plurality of silicon wafers.

Such P type buffer layer is diagrammatically shown in the cross-sectional illustration of FIG. 1 and the reactor equipment itself is illustrated in FIG. 2. Typically, the reactor chamber 21 can accommodate a plurality of multi-inch diameter wafers 10 which are distributed on a susceptor 23 that is rotated within the reactor chamber to obtain an evenly formed, continuous epitaxial growth of gallium arsenide upon the silicon wafers. In the processing sequence to be described below, on the planar surface 11 of a silicon substrate 10 (see FIG. 1), a nucleation growth layer 13 is first deposited, followed by the formation of the desired gallium arsenide layer 15 to a prescribed thickness (e.g. on the order of 2.5 microns).

Each individual silicon substrate wafer is preferably sliced or cut so that it is misoriented vicinal to the (100) crystallographic plane. Preferably, the degree of inclination is between 0° and 4° towards the [011] crystallographic direction. Prior to being inserted into growth chamber 21, each wafer 10 has its top surface 11 etched in a dilute solution of hydrofluoric acid. The wafer is then rinsed in deionized water, dried with filtered nitrogen and immediately inserted onto the susceptor 23 within the growth chamber 21.

Gas flow and ambient control of the atmosphere within the reactor chamber 21 are effected by hydrogen, arsine and trimethylgallium gas sources 31, 33 and 35, respectively coupled to the growth chamber 21 through gas conduits 41, 43 and 45. Axially located within the growth chamber 21, about which susceptor 23 rotates are gas injection tubes, diagrammatically shown at 25 and 27 above the exposed surface of the susceptor and, thereby, the exposed surfaces of the silicon wafers 10 upon which gallium arsenide layers are to be formed. An exhaust tube 51 is coupled to the growth chamber for gas removal. Throughout the process the interior of chamber 21 is maintained at atmospheric pressure.

Initially, reactor chamber 21 is subjected to a hydrogen purge and the temperature is ramped up to a value on the order 900° C. in an arsine/hydrogen ambient, to bake the wafers 10 for a period on the order of 5 minutes. This high temperature bake facilitates impurity desorption and surface reconstruction.

Following this initial baking step, a thin nucleation layer 13 (having a thickness on the order of 100 Å to 500 Å (e.g. 400 Å) is grown on the top surface 11 of silicon substrate by introducing trimethylgallium and arsine gases at a temperature on the order of 375° to 475° (e.g. 425° C.), with the gas introduction rate being such that the molar ratio of the V component (arsenic) to the III component (gallium) is an intermediate value on the order of 10.0. Following the growth of the thin nucleation layer 13 (FIG. 1), the temperature of the reactor is increased to a value on the order of 500° C.—to—700° C. (e.g. 630° C.) and the introduction of arsine and trimethylgallium gas is adjusted to reduce V/III mole ratio to a value less than 5 (e.g. on the order of 2.5). In the course of this reduction in the mole ratio of arsenic to gallium in the gas ambient, a gallium arsenide buffer layer 15 is epitaxially grown atop the nucleation layer 13. For a growth rate of 5 microns per hour, the growth conditions are maintained for a period of approximately 30 minutes to cause the growth of a 2.5 micron thick P-type gallium arsenide buffer layer 15.

As pointed out above, the low V/III molar ratio within the growth ambient employed for the epitaxial deposition of the gallium arsenide buffer layer 15 results in a substantial number of arsenic vacancies in the crystallographic structure of the layer 15. These arsenic vacancies are filled by carbon atoms within the trimethylgallium compound. Carbon, an amphoteric dopant in gallium arsenide, behaves as an acceptor and causes the conductivity of gallium arsenide buffer layer 15 to be P-type. For the particular processing parameters described here, the resulting hole concentration of buffer layer 15 at room temperature was measured to be on the order of $3-5 \times 10^{15}$ cm$^{-3}$ (using a mercury Schottky contact).

Examination of the crystallinity of the resulting gallium arsenide buffer layer 15 did not reveal inferior crystal structure due to the reduced arsenic over-pressure (low V/III mole ratio). Specifically, hardly any difference in the X-ray diffractometry data or surface morphology is observed. An X-ray rocking curve reveals a full width at half-maximum (FWHM) of 5-7 arc minutes, which is a (004) diffracted peak with silicon used as the base crystal substrate. (The crystallinity of as-grown N type layers of gallium arsenide on silicon has been investigated and found to yield values for FWHM ranging from 5 to 6 arc-minutes.) An examination of the gallium arsenide buffer layer 15 with a scanning electron microscope revealed a surface that is substantially smooth and free of pits or voids.

Crystal quality has also been examined using transmission electron microscopy. While some dislocations were noted, very few microtwin defects were observed. While the total defect density, dislocations, microtwins, etc. was found to be approximately the same as that of N type GaAs (on the order of $5 \times 10^8$ cm$^{-2}$), the microtwin density is less in the P-type material at $2 \times 10^7$ cm$^{-2}$, which is approximately and order of magnitude less than in N type material. This improvement in microtwin density defects is also believed to be due to the low V/III mole ratio during MOCVD growth.

Photoluminescence of the resulting P type gallium arsenide buffer layer 15 under a low-level excitation at 1.8 k revealed only a single peak. This is in marked contrast to the emission from N type material where multiple lines are believed to be due to a splitting in the valence band from the biaxial tensile stress. In the material obtained in accordance with the growth process of the present invention, it is believed that the peak is due to the presence of the carbon acceptors. Assuming that the free electron-to-carbon acceptor transition (26 meV) follows the heavy hole band under biaxial tensile stress ($-10.4$ meV/kbar)[8], then the strain experienced by the crystal along the growth plane is 3.5 kbar. The comparability of this value to those reported in the literature supports the conclusion regarding the carbon atom acceptor mechanism.

Figure 3:
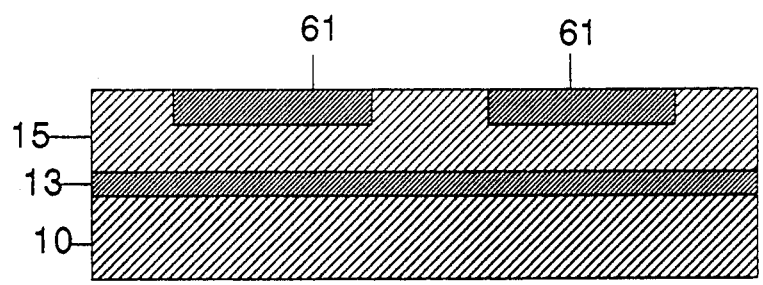
FIG. 3 diagrammatically shows a semiconductor structure having a plurality of N channel devices formed in the surface of the P-type gallium arsenide layer.

The P type gallium arsenide on silicon layer manufactured in accordance with the above-described process has been successfully used for the fabrication of large scale integrated circuit gate arrays having N channel MESFETs as the active devices. FIG. 3, diagrammatically shows such a structure having a plurality of N channel devices 61 formed in the surface of the P-type gallium arsenide layer 15. Because of the P-type conductivity of the gallium arsenide, the respective devices are isolated by the PN junctions formed between (ion-implanted) N type material of the devices and the P-type substrate 15.

Measurements of bulk material leakage of the P type material have revealed a leakage current of only several microamps in response to the application of a potential difference of 5 volts. N-type material, on the other hand, exhibits a substantially large leakage current equal to the supply compliance of 100 mA at 3.2 volts.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of growing an unintentionally doped, single crystalline P-type Group III-V compound semiconductor layer on a Group IV semiconductor substrate comprising the steps of:
   (a) providing a Group IV semiconductor substrate in a growth reactor;
   (b) growing a nucleation layer of Group III-V compound semiconductor material on said Group IV semiconductor substrate by introducing into said growth reactor an organic Group III semiconductor compound gas and a Group V semiconductor material containing gas at a prescribed temperature and mole ratio of Group V semiconductor material to Group III semiconductor material; and
   (c) adjusting the introduction of said organic Group III semiconductor compound gas and said Group V semiconductor material containing gas, without the addition of an acceptor impurity, into said growth reactor so as to correspondingly adjust the mole ratio of Group V semiconductor material to Group III compound semiconductor material to a value that causes the formation of Group V semiconductor material vacancies in a buffer Group III-V compound semiconductor layer that is grown on said nucleation layer and the substitution of acceptor atoms from said organic Group III semiconductor compound gas at said vacancies, so as to cause the conductivity of the resultant Group III-V compound semiconductor layer that is grown on said nucleation layer to be P-type.

2. A method according to claim 1, wherein said Group IV semiconductor substrate is silicon, said organic Group III semiconductor compound gas is an organic gallium compound gas and said Group V semiconductor material containing gas is arsine.

3. A method according to claim 2, where step (c) comprises adapting the introduction of said organic gallium compound gas and arsine gas so as to adjust said mole ratio to a value less than 5.0.

4. A method according to claim 3, wherein said mole ratio is a value on the order of 2.5.

5. A method according to claim 3, wherein said organic gallium compound gas comprises trimethylgallium gas.

6. A method according to claim 5, wherein step (c) is carried out at a temperature on the order of 500° C. to 700° C. (630°)C.

7. A method of growing an unintentionally doped, single crystalline P-type conductivity gallium arsenide layer on silicon substrate comprising the steps of:
   (a) growing a gallium arsenide nucleation layer on a surface of a silicon substrate by exposing said silicon substrate to gas ambient of arsine and an organic gallium compound;
   (b) adjusting said gas ambient, without the addition of an acceptor impurity such that the mole ratio of arsenic to gallium in said gas ambient has a value that causes the creation of arsenic vacancies in a gallium arsenide buffer layer that grows on said nucleation layer and the substitution thereat of acceptor atoms from said organic gallium compound, whereby the conductivity of gallium arsenide grown on said nucleation layer is P-type.

8. A method according to claim 7, wherein step (b) is carried out at atmospheric pressure and at a temperature in a range of from 500° C. to 700° C.

9. A method according to claim 7, wherein said mole ratio has a value no greater than 5.0.

10. A method according to claim 9, wherein said mole ratio is on the order of 2.5.

11. A method according to claim 7, wherein step (a) is carried out at atmospheric pressure, at a temperature in a range of from 375° C. to 475° C., at a mole ratio of arsenic to gallium in said gas ambient in excess of 2.0, and step (b) is carried out at atmospheric pressure, at a temperature in a range of from 500° C. to 700° C., and at a mole ratio less than 5.0.

12. A method according to claim 11, wherein said surface of said silicon substrate is misoriented from the (100) crystallographic plane toward the [011] crystallographic direction.

13. A method according to claim 1 wherein steps (a)–(c) are carried out at atmospheric pressure.

* * * * *